United States Patent
Hong et al.

(10) Patent No.: US 8,553,370 B2
(45) Date of Patent: Oct. 8, 2013

(54) TMR READER STRUCTURE HAVING SHIELD LAYER

(75) Inventors: Liubo Hong, San Jose, CA (US); Honglin Zhu, Fremont, CA (US); Tsann Lin, Saratoga, CA (US); Zheng Gao, San Jose, CA (US)

(73) Assignee: HGST Netherlands B.V., Amsterdam (NL)

( * ) Notice: Subject to any disclaimer, the term of this patent is extended or adjusted under 35 U.S.C. 154(b) by 260 days.

(21) Appl. No.: 12/954,334

(22) Filed: Nov. 24, 2010

(65) Prior Publication Data

US 2012/0127615 A1    May 24, 2012

(51) Int. Cl.
*G11B 5/39*    (2006.01)

(52) U.S. Cl.
USPC ........................................ 360/324.2; 360/319

(58) Field of Classification Search
USPC .......... 360/319, 324.1, 324.11, 324.12, 324.2
See application file for complete search history.

(56) References Cited

U.S. PATENT DOCUMENTS

| | | | |
|---|---|---|---|
| 5,446,613 A | 8/1995 | Rottmayer | |
| 6,198,609 B1 | 3/2001 | Barr et al. | |
| 6,327,107 B1 | 12/2001 | Komuro et al. | |
| 7,046,487 B2 | 5/2006 | Terunuma | |
| 7,869,166 B2 * | 1/2011 | Miyauchi et al. | 360/324.11 |
| 8,296,930 B2 * | 10/2012 | Funada et al. | 29/603.14 |
| 2004/0240124 A1 * | 12/2004 | Sbiaa | 360/324.11 |
| 2007/0086122 A1 | 4/2007 | Freitag et al. | |
| 2008/0062573 A1 | 3/2008 | Tatewaki | |
| 2008/0080097 A1 | 4/2008 | Nagasaka | |
| 2008/0112096 A1 * | 5/2008 | Mizuno et al. | 360/324.12 |
| 2008/0137237 A1 * | 6/2008 | Freitag et al. | 360/324.12 |
| 2008/0144235 A1 * | 6/2008 | Gill | 360/324.12 |
| 2008/0239585 A1 | 10/2008 | Ousugi et al. | |
| 2009/0046395 A1 | 2/2009 | Maehara et al. | |
| 2009/0174968 A1 | 7/2009 | Singleton et al. | |
| 2009/0207533 A1 * | 8/2009 | Shimazawa | 360/324.1 |
| 2009/0207534 A1 * | 8/2009 | Miyauchi et al. | 360/324.11 |
| 2010/0128400 A1 | 5/2010 | Lin | |
| 2011/0102949 A1 * | 5/2011 | Yuan et al. | 360/324.2 |

FOREIGN PATENT DOCUMENTS

| | | |
|---|---|---|
| JP | 2008108338 A | 5/2008 |
| JP | 2009087474 A | 4/2009 |

OTHER PUBLICATIONS

Chen et al. "2 Tbit/in2 Reader Design Outlook," IEEE Transactions on Magnetics, vol. 46, No. 3, Mar. 2010, pp. 697-701.

* cited by examiner

*Primary Examiner* — Jefferson Evans
(74) *Attorney, Agent, or Firm* — Patterson & Sheridan, LLP

(57) ABSTRACT

The present invention generally relates to a TMR reader and a method for its manufacture. The TMR reader discussed herein adds a shield layer to the sensor structure. The shield layer is deposited over the capping layer so that the shield layer and the capping layer collectively protect the free magnetic layer within the sensor structure from damage during further processing. Additionally, the hard bias layer is shaped such that the entire hard bias layer underlies the hard bias capping layer so that a top lead layer is not present. By eliminating the top lead layer and including a shield layer within the sensor structure, the read gap is reduced while still protecting the free magnetic layer during later processing.

10 Claims, 3 Drawing Sheets

TMR READER STRUCTURE HAVING SHIELD LAYER

BACKGROUND OF THE INVENTION

1. Field of the Invention

Embodiments of the present invention generally relate to a tunnelling magnetoresistive (TMR) reader and a method for its manufacture.

2. Description of the Related Art

TMR readers are used in hard disk drives to read bits of data from the hard disk drive. An example of a TMR reader is shown in FIG. 1. The TMR reader 100 includes a first shield layer 102 and a sensor structure including a pinned magnetic layer 104, a barrier layer 106, a free magnetic layer 108 and a capping layer 110. The TMR reader 100 also includes an insulating layer 112, a hard bias layer 114, a hard bias capping layer 116, a top lead layer 118, and the second shield layer 120.

The capping layer 110 is used to protect the free magnetic layer 108 during later processing steps. In order to adequately protect the free magnetic layer 108, the capping layer 110 may have a thickness of between about 4 nm and about 8 nm. The top lead layer 118 is present on both the sensor structure and the hard bias capping layer 116 to provide magnetic separation between the hard bias layer 114 and the second shield layer 120. Both the capping layer 110 and the top lead layer 118 are non-magnetic.

One major limitation of the TMR reader 100 is the difficulty in scaling down the magnetic read gap (RG) dimension, which is the distance between the first shield layer 102 and the second shield layer 120. Sufficient thickness of the top lead layer 118 is needed to provide the magnetic separation between the hard bias layer 114 and the second shield layer 120. Additionally the capping layer 110 needs to be sufficiently thick to protect the free magnetic layer 108 from damage during further processing. Both the thickness of the capping layer 110 and the thickness of the top lead layer 118 combine to limit the distance from the free magnetic layer 108 to the second shield layer 120 and in turn, limit the TMR magnetic RG scaling down.

SUMMARY OF THE INVENTION

The present invention generally relates to a TMR reader and a method for its manufacture. The TMR reader discussed herein adds a shield layer to the sensor structure. The shield layer is deposited over the capping layer so that the shield layer and the capping layer collectively protect the free magnetic layer within the sensor structure from damage during further processing. Additionally, the hard bias layer is shaped such that the entire hard bias layer underlies the hard bias capping layer so that a top lead layer is not present. By eliminating the top lead layer and including a shield layer within the sensor structure, the RG is reduced while still protecting the free magnetic layer during later processing.

In one embodiment, a TMR reader includes a first shield layer having a first portion and a second portion and a sensor structure disposed over the first portion and having a topmost layer comprising a magnetic material. The sensor structure has sidewalls. The TMR reader also includes an insulating layer disposed over the second portion and the sidewalls, a hard bias layer disposed over the insulating layer, a hard bias capping layer disposed over the hard bias layer, and a second shield layer disposed on the hard bias capping layer and the topmost layer of the sensor structure.

In another embodiment, a method includes depositing a pinned magnetic layer over a first shield layer, depositing a barrier layer over the pinned magnetic layer, depositing a free magnetic layer over the barrier layer, depositing a capping layer over the free magnetic layer, and depositing a second shield layer over the capping layer. The method also includes removing material from the pinned magnetic layer, the barrier layer, the free magnetic layer, the capping layer and the second shield layer to expose the first shield layer and to define a sensor structure having sidewalls. The method additionally includes depositing an insulating layer over the exposed first shield layer and the sidewalls, depositing a hard bias layer over the insulating layer, depositing a hard bias capping layer over the hard bias layer, and depositing a third shield layer on the hard bias capping layer and the second shield layer.

In another embodiment, a method includes forming a sensor structure over a first portion of a first shield layer. The sensor structure has sidewalls and a top surface. The method also includes depositing an insulating layer over a second portion of the first shield layer and the sidewalls, depositing a hard bias layer over the insulating layer, removing material from the hard bias layer, depositing a hard bias capping layer over the hard bias layer such that the hard bias capping layer contacts the insulating layer, and depositing a second shield layer on the hard bias capping layer and the top surface of the sensor structure.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

In the following, reference is made to embodiments of the invention. However, it should be understood that the invention is not limited to specific described embodiments. Instead, any combination of the following features and elements, whether related to different embodiments or not, is contemplated to implement and practice the invention. Furthermore, although embodiments of the invention may achieve advantages over other possible solutions and/or over the prior art, whether or not a particular advantage is achieved by a given embodiment is not limiting of the invention. Thus, the following aspects, features, embodiments and advantages are merely illustrative and are not considered elements or limitations of the appended claims except where explicitly recited in a claim(s). Likewise, reference to "the invention" shall not be construed as a generalization of any inventive subject matter disclosed herein and shall not be considered to be an element or limitation of the appended claims except where explicitly recited in a claim(s).

The present invention generally relates to a TMR reader and a method for its manufacture. The TMR reader discussed herein adds a shield layer to the sensor structure. The shield layer is deposited over the capping layer so that the shield layer and the capping layer collectively protect the free magnetic layer within the sensor structure from damage during further processing. Additionally, the hard bias layer is shaped such that the entire hard bias layer underlies the hard bias capping layer so that a top lead layer is not present. By eliminating the top lead layer and including a shield layer within the sensor structure, the RG is reduced while still protecting the free magnetic layer during later processing.

FIGS. 2A-2F are schematic cross-sectional views of a TMR sensor 200 at various stages of production. The TMR sensor 200 includes a first shield layer 202. The first shield layer 202 may comprise a ferromagnetic material. Suitable ferromagnetic materials that may be utilized include Ni, Fe, Co, NiFe, NiFeCo, NiCo, CoFe and combinations thereof.

Figure 2A:
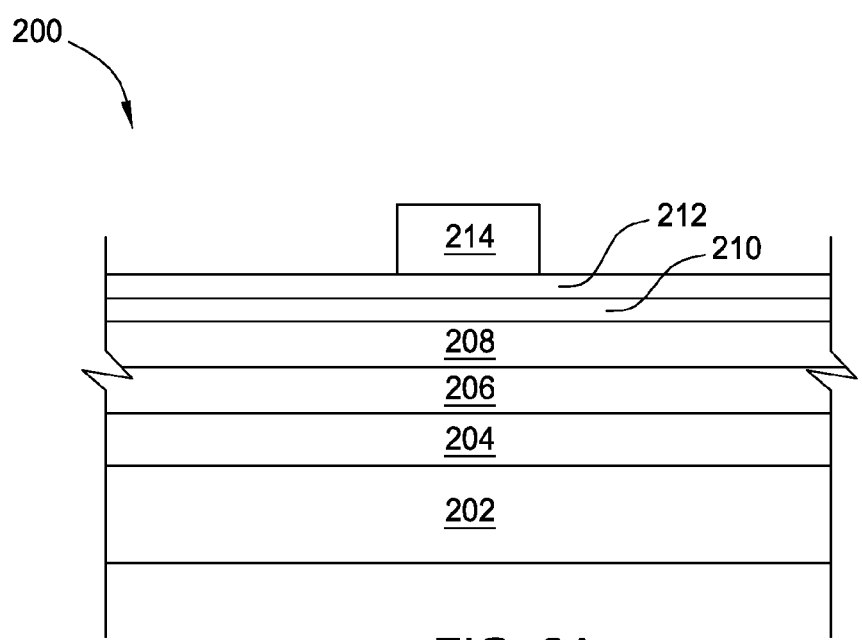
FIGS. 2A-2F are schematic cross-sectional views of a TMR sensor 200 at various stages of production.

Over the first shield layer 202, the layers that will comprise the sensor structure may be deposited as shown in FIG. 2A. A first layer 204 that will eventually become the pinned magnetic layer 216 is deposited on the first shield layer 202. The pinned magnetic layer 216 may be one of several types of pinned layers, such as a simple pinned, antiparallel pinned, self pinned or antiferromagnetic pinned sensor. For purposes of simplicity, the sensor will be described herein as an antiparallel pinned, antiferromagnetic pinned sensor having a first antiparallel layer, a second antiparallel layer, and a non-magnetic, antiferromagnetic coupling layer, such as Ru sandwiched therebetween. The first and second antiparallel layers can be constructed of several magnetic materials such as, for example NiFe or CoFe, and have magnetic moments that are pinned by exchange coupling of the first antiparallel layer with a layer of antiferromagnetic layer. The antiferromagnetic layer may include materials such as IrMn or PtMn.

A second layer 206 that will eventually become the barrier layer 218 is deposited on the first layer 204. The second layer 206 may comprise an insulating material such as alumina or magnesium oxide. A third layer 208 that will eventually become the free magnetic layer 220 is deposited on the second layer 206. The third layer 208 may comprise ferromagnetic material such as Co, CoFe, NiFe or combinations thereof. A fourth layer 210 that will eventually become the cap layer 222 is deposited on the third layer 208. The fourth layer 210 may comprise a material to protect the sensor from damage such as ruthenium or tantalum or combination of similar materials. The fourth layer 210 may have a thickness of between about 1 nm and about 2 nm. A fifth layer 212 that will eventually become a third shield layer 224 is then deposited over the fourth layer 210. The fifth layer 212 may comprise a ferromagnetic material. Suitable ferromagnetic materials that may be utilized include Ni, Fe, Co, NiFe, NiFeCo, NiCo, CoFe and combinations thereof. The fifth layer 212 may have a thickness of between about 2 nm and about 8 nm.

Figure 2B:
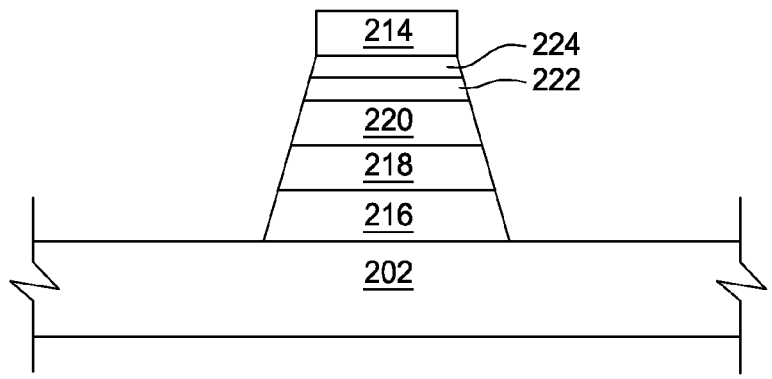
Figure 2C:
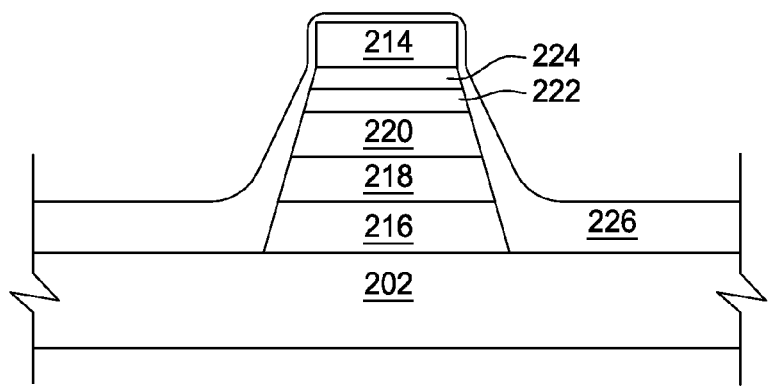

A photoresist mask 214 is then formed on the fifth layer 212 by depositing and developing a photoresist layer. Material from the first layer 204, the second layer 206, the third layer 208, the fourth layer 210, and the fifth layer 212 is then removed to form the pinned magnetic layer 216, the barrier layer 218, the free magnetic layer 220, the capping layer 222, and the third shield layer 224 that define the sensor structure as shown in FIG. 2B. The material may be removed by an ion milling process to leave the sensor structure over a first portion of the first shield layer 202 while exposing a second portion of the first shield layer 202. A layer of insulating material 226 is then deposited over the entire structure including the first shield layer 202, the sidewalls of the sensor structure and the photoresist mask 214 as shown in FIG. 2C.

Figure 2D:
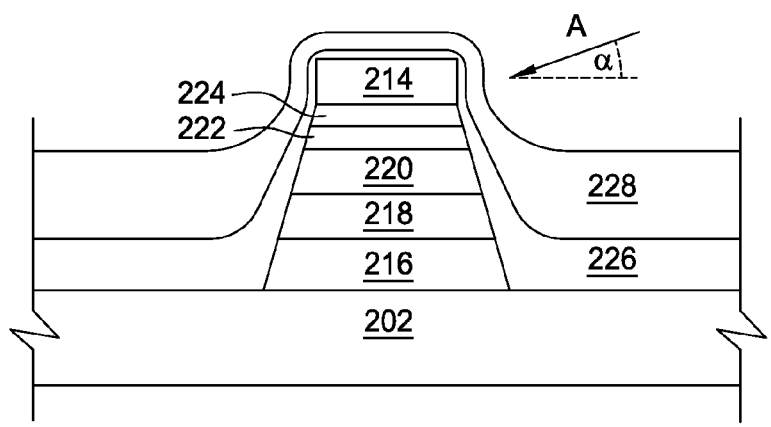
Figure 2E:
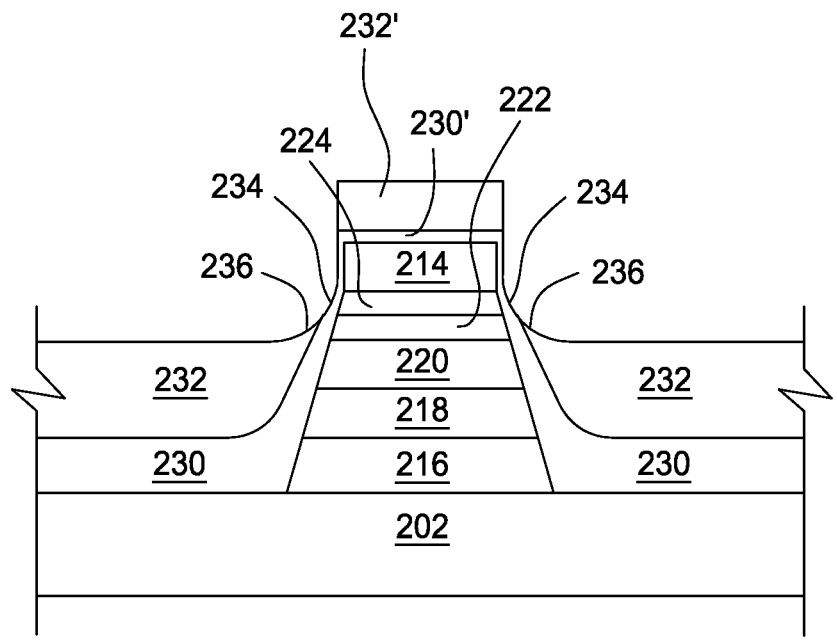

Over the layer of insulating material 226, a layer 228 that forms the hard bias layer 232 is deposited. Both layer 228 and layer 226 are then patterned to remove some material and form the insulating layer 230 and the hard bias layer 232. The patterning may occur by exposing both layers 226, 228 to ion milling. The ions may be directed at an angle α relative to the surface of the first shield layer 202 as shown in FIG. 2D. The ion milling will occur at an angle between about 5 degrees and about 15 degrees to remove material from both layer 226 and 228 to expose an edge 234 of the insulating layer 230 and a top corner 236 of the hard bias layer 232 as shown in FIG. 2E. Hard bias material 232' remains on the top photoresist mask 214, but has been removed from the edges. Insulating material 230' remains on both the top and edges of the photoresist mask 214, although the thickness of the insulating material 230' on the edges has decreased due to some etching.

The hard bias capping layer 238 is then formed over both the hard bias layer 232 and the insulating layer 230 such that the hard bias capping layer 238 is formed on the edge 234 of the insulating layer 230 and is thus coupled to the insulating layer 230. The hard bias layer 232 therefore does not extend to as great a height above the first shield layer 202 as does the hard bias capping layer 238 and the insulating layer 230. The layers of the hard bias material 232' and the insulating material 230' that are on top of and on the side of the photoresist mask 214 are removed. The photoresist mask 214 is then removed and a CMP process may be performed to provide a smooth surface for deposition of the second shield layer 240. The hard bias layer 232 is spaced from the sensor structure by the insulating layer 230 and from the second shield layer 240 by the hard bias capping layer 238. The layers 230, 232, and 238 each may have multiple layers. The hard bias capping layer 238 and the third shield layer 224 may be cleaned by sputter etching.

Figure 2F:
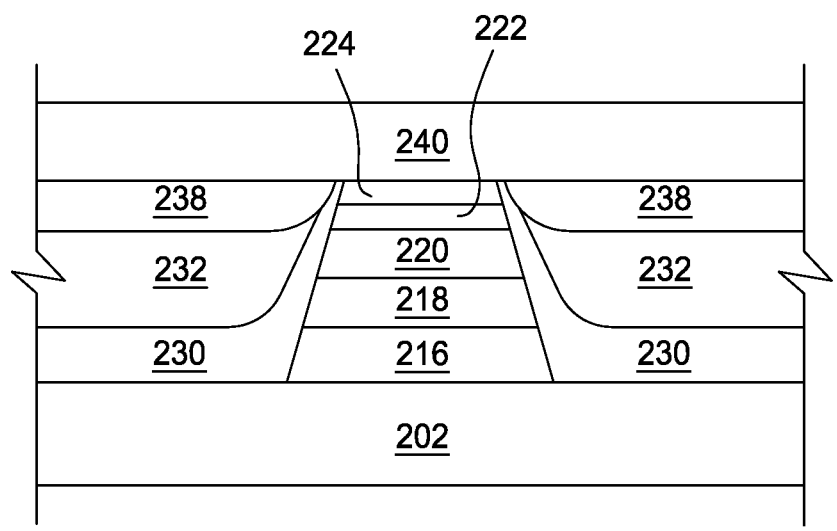

Between FIG. 2E and FIG. 2F, the third shield layer 224 may change in thickness because during the deposition of the second shield layer 240, a sputter etch clean is used on the third shield layer 224. As shown in FIG. 2F, the second shield layer 240 is formed over the hard bias capping layer 238, the insulating layer 230 and the third shield layer 224. Thus, a top lead layer is neither present nor necessary to space the hard bias layer 232 from the second shield layer 240 because the hard bias capping layer 238 is sufficient. Suitable ferromagnetic materials that may be utilized for the second shield layer 240 include Ni, Fe, Co, NiFe, NiFeCo, NiCo, CoFe and combinations thereof.

Figure 1A:
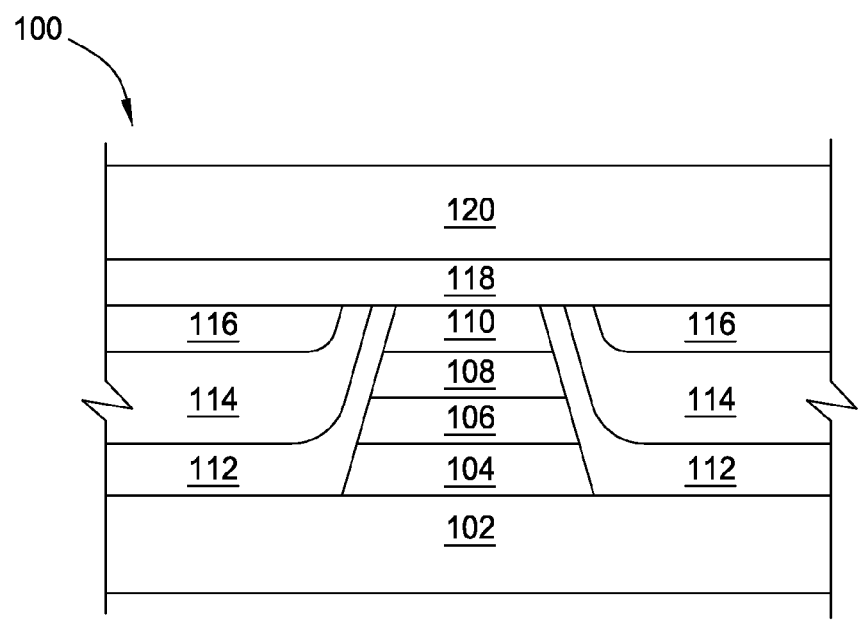
FIG. 1 is a schematic cross-sectional view of a prior art TMR sensor 100.

The capping layer 222 and the third shield layer 224 collectively approximate the thickness of the capping layer 110 of FIG. 1 and collectively protect the free magnetic layer 220 during further processing. The third shield layer 224 is a part of the sensor structure. The sensor structure of FIG. 2F has approximately the same height as the sensor structure of FIG. 1, yet the first shield layer 202 is closer to the ferromagnetic material that is used for shield layers 224, 240 because the third shield layer 224 is closer to the first shield layer 202 as compared to the TMR reader 100 of FIG. 1 that does not have a third shield layer. In essence, the third shield layer 224 is the equivalent of extending the second shield layer 240 down into the sensor structure. Thus, the distance between the first shield layer 202 and the second shield layer 240 is reduced while maintaining sufficient thickness of the layers above the free magnetic layer 220 to protect the free magnetic layer 220 during further processing. Additionally, due to the shape of the hard bias capping layer 238 and the hard bias layer 232, a top lead layer is not utilized. The hard bias layer 232 is spaced from the second shield layer 240 by the hard bias capping layer 238.

The top surface of the third shield layer 224 and the top surface of the hard bias capping layer 238 are spaced substantially the same distance from the top surface of the first shield layer. Additionally, the hard bias layer 232 is isolated from the second shield layer 240 by the hard bias capping layer 238 that is in contact with the insulating layer 230. Thus, the second shield layer 240 is in contact with the hard bias capping layer 238, the insulating layer 230 and the topmost surface of the third shield layer 224.

Due to the third shield layer 224 being within the sensor stack and the absence of a top lead layer, the total RG of the TMR reader 200 is thinner than TMR reader 100 by between about 4 nm and about 8 nm.

While the foregoing is directed to embodiments of the present invention, other and further embodiments of the invention may be devised without departing from the basic scope thereof, and the scope thereof is determined by the claims that follow.

What is claimed is:

1. A TMR reader, comprising:
    a first shield layer having a first portion and a second portion;
    a sensor structure disposed over the first portion and having a topmost layer comprising a magnetic material, the sensor structure having sidewalls, wherein the sensor structure comprises:
        a pinned magnetic layer disposed over the first shield layer;
        a barrier layer disposed over the pinned magnetic layer;
        a free magnetic layer disposed over the barrier layer;
        a capping layer disposed over the free magnetic layer; and
        a third shield layer disposed over the capping layer and comprising the magnetic material;
    an insulating layer disposed over the second portion and the sidewalls;
    a hard bias layer disposed over the insulating layer;
    a hard bias capping layer disposed over the hard bias layer; and
    a second shield layer disposed on the hard bias capping layer and the topmost layer of the sensor structure.

2. The TMR reader of claim 1, wherein the third shield layer is selected from the group consisting of Ni, Fe, Co, NiFe, NiFeCo, NiCo, CoFe and combinations thereof.

3. The TMR reader of claim 2, wherein the top surface of the third shield layer and the top surface of the hard bias capping layer are spaced substantially the same distance from the top surface of the first shield layer.

4. The TMR reader of claim 1, wherein the top surface of the third shield layer and the top surface of the hard bias capping layer are spaced substantially the same distance from the top surface of the first shield layer.

5. The TMR reader of claim 1, wherein the second shield layer is in contact with the hard bias capping layer, the topmost layer of the sensor structure and the insulating layer.

6. The TMR reader of claim 1, wherein the hard bias capping layer is in contact with the insulating layer.

7. A TMR reader, comprising:
    a first shield layer having a first portion and a second portion;
    a sensor structure disposed over the first portion and having a topmost layer comprising a magnetic material, the sensor structure having sidewalls, wherein the sensor structure comprises:
        a pinned magnetic layer disposed over the first shield layer;
        a barrier layer disposed over the pinned magnetic layer;
        a free magnetic layer disposed over the barrier layer;
        a capping layer disposed over the free magnetic layer; and
        a third shield layer disposed over the capping layer and comprising the magnetic material;
    an insulating layer disposed over the second portion and the sidewalls;
    a hard bias layer disposed over the insulating layer;
    a hard bias capping layer disposed over the hard bias layer; and
    a second shield layer disposed on and contacting the hard bias capping layer, the insulating layer and the topmost layer of the sensor structure.

8. The TMR reader of claim 7, wherein the third shield layer is selected from the group consisting of Ni, Fe, Co, NiFe, NiFeCo, NiCo, CoFe and combinations thereof.

9. The TMR reader of claim 7, wherein the top surface of the third shield layer and the top surface of the hard bias capping layer are spaced substantially the same distance from the top surface of the first shield layer.

10. The TMR reader of claim 7, wherein the hard bias capping layer is in contact with the insulating layer.

* * * * *